(12) United States Patent
Wildhagen

(10) Patent No.: US 7,046,811 B1
(45) Date of Patent: May 16, 2006

(54) STEREO DEMULTIPLEXER

(75) Inventor: Jens Wildhagen, Weinstadt (DE)

(73) Assignee: SONY International (Europe) GmbH, Berlin (DE)

( * ) Notice: Subject to any disclaimer, the term of this patent is extended or adjusted under 35 U.S.C. 154(b) by 966 days.

(21) Appl. No.: 09/619,552

(22) Filed: Jul. 19, 2000

(30) Foreign Application Priority Data

Jul. 21, 1999 (EP) .................................. 99114354

(51) Int. Cl.
*H04H 5/00* (2006.01)

(52) U.S. Cl. .............................. 381/2; 455/47; 375/254

(58) Field of Classification Search ................. 381/94, 381/94.3, 1–16; 375/254, 270, 285, 321, 375/347, 327; 455/296, 226, 4, 7, 203

See application file for complete search history.

(56) References Cited

U.S. PATENT DOCUMENTS

| | | | | |
|---|---|---|---|---|
| 4,206,317 A | * | 6/1980 | Kahn | 370/201 |
| 4,602,380 A | * | 7/1986 | Stebbings | 381/13 |
| 4,853,686 A | * | 8/1989 | Kueng et al. | 340/825.21 |
| 5,008,939 A | * | 4/1991 | Bose et al. | 381/15 |
| 5,056,122 A | * | 10/1991 | Price | 375/324 |
| 5,067,157 A | * | 11/1991 | Ishida et al. | 381/13 |
| 5,222,252 A | * | 6/1993 | Kasser | 455/67.13 |
| 5,257,312 A | * | 10/1993 | Therssen et al. | 381/4 |
| 5,377,272 A | * | 12/1994 | Albean | 381/13 |
| 5,404,405 A | | 4/1995 | Collier et al. | |
| 5,760,737 A | * | 6/1998 | Brenner | 342/357 |
| 6,108,810 A | * | 8/2000 | Kroeger et al. | 714/790 |
| 6,192,238 B1 | * | 2/2001 | Piirainen | 455/422.1 |
| 6,243,424 B1 | * | 6/2001 | Kroeger et al. | 375/265 |
| 6,272,226 B1 | * | 8/2001 | Khan et al. | 381/4 |
| 6,671,378 B1 | * | 12/2003 | Wildhagen | 381/2 |
| 6,738,610 B1 | * | 5/2004 | Wildhagen | 455/296 |

FOREIGN PATENT DOCUMENTS

| | | |
|---|---|---|
| DE | 41 28 045 | 2/1993 |
| EP | 0 512 606 | 11/1992 |
| EP | 0512 606 | * 11/1992 |

* cited by examiner

*Primary Examiner*—Huyen Le
*Assistant Examiner*—Lun-See Lao
(74) *Attorney, Agent, or Firm*—Oblon, Spivak, McClelland, Maier & Neustadt, P.C.

(57) ABSTRACT

For the noise reduction of an audio signal generated by stereo-demultiplexing of a frequency-modulated stereo multiplex signal ($S_{FM}(t)$) a filtering within the signal path to generate the stereo difference signal ($u_d(t)$) is performed that determines a weight with which the upper sideband ($u_{d,u}(t)$) and the lower sideband ($u_{d,l}(t)$) of the amplitude modulated stereo-difference signal are weighted with different weighting factors that are dependent on the frequency.

25 Claims, 10 Drawing Sheets

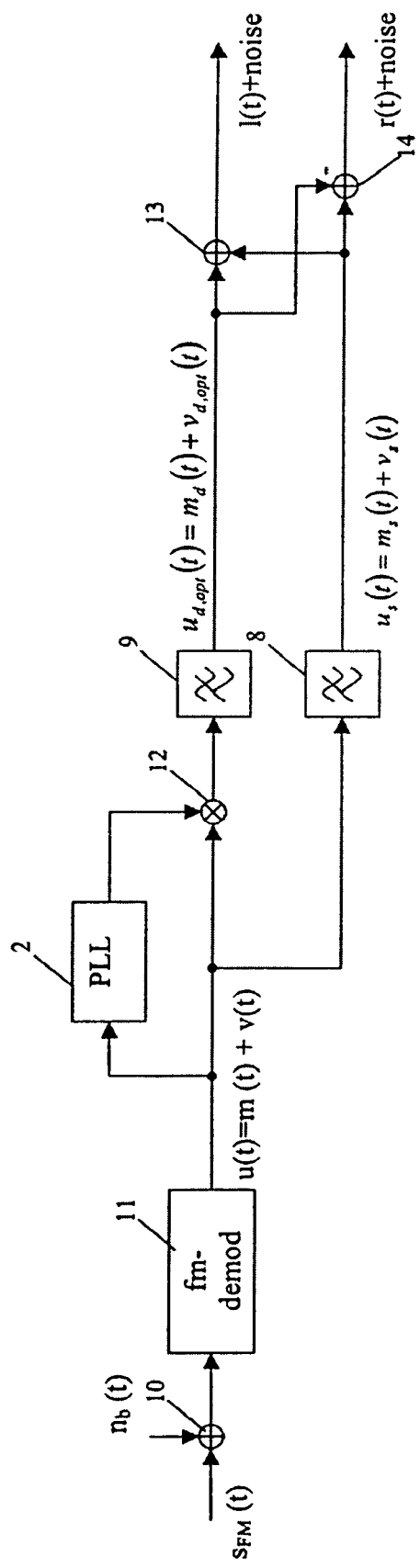
Figure 10: (PRIOR ART)

STEREO DEMULTIPLEXER

BACKGROUND OF THE INVENTION (1) Field of the Invention

The present invention relates to a method and a device to demultiplex a frequency modulated stereo-multiplex signal, in particular to an improvement of the signal to noise ratio of a transmitted audio signal.

(2) Description of Related Art

In fm-broadcasting a stereo-multiplex signal is frequency modulated. The stereo-multiplex signal consists of a stereo-sum signal and a stereo-difference signal. The stereo-difference signal is amplitude modulated with suppressed carrier. To allow a coherent amplitude demodulation of the stereo-difference signal at the receiver, a pilot carrier with half the AM-carrier frequency is added to the stereo-multiplex signal.

The stereo-sum signal and the stereo-difference signal are defined by $$m_s(t) = a_l(t) + a_r(t)$$

$$m_d(t) = a_l(t) + a_r(t)$$

The stereo-multiplex signal is defined by $$m_{stmux}(t) = m_s(t) + \sin(2\omega_{pil}t) \cdot m_d(t) + A_{pil} \cdot \sin(\omega_{pil}t)$$

The stereo-multiplex signal is frequency modulated:

$$S_{FM}(t) = A_{FM} \cos\left(\omega_c(t) + \Delta\omega \int_{-\infty}^{t} m_{stmux}(\tau) d\tau\right)$$

with $\omega_c$: carrier frequency $\Delta\omega$: frequency deviation

At the receiver side the frequency modulated stereo-multiplex signal is frequency demodulated and stereo-demultiplexed to calculate the left and right audio signal.

For the stereo demultiplexing, the stereo demultiplexer needs to recover the 2nd harmonic of the pilot carrier. Therefore, a PLL locks to the pilot carrier and generates the 2nd harmonic of the pilot carrier. The 2nd harmonic, that is locked in phase to the pilot carrier is needed for the coherent amplitude demodulation of the stereo-difference signal.

FIG. 10 shows the basic functionality of a state of the art stereo-demultiplexer. For the sake of simplicity the noise $n_b(t)$ added to the frequency modulated stereo-multiplex signal $S_{FM}(t)$ on the transmitter side, the receiver side and within the transmission channel is shown to be added to the frequency modulated stereo-multiplex signal $S_{FM}(t)$ by way of an adder 10 just before the frequency demodulator 11 of the stereo-demultiplexer shown in FIG. 10. Therefore, the frequency demodulator 11 outputs a stereo-multiplex signal u(t) that consists of the stereo-multiplex signal $m_{stmux}(t)$ as generated on the transmitter side and additionally an added noise component v(t) that is the frequency demodulated noise signal $n_b(t)$. On basis of this stereo-multiplex signal u(t) a PLL-circuit 2 generates the 2nd harmonic of the pilot carrier, i.e. a signal that is in phase to the pilot carrier with twice the frequency of the pilot carrier, which is needed for the coherent amplitude demodulation of the stereo-multiplex signal u(t) to gain the stereo-difference signal $u_d(t)$. This coherent amplitude demodulation is performed by way of a demodulator 12 which receives the stereo-multiplex signal u(t) at its first input and the 2nd harmonic of the pilot carrier at its second input. The output signal of the demodulator 12 is input to a filter 9 which outputs the stereo-difference signal $u_d(t)$ that consists of the stereo-difference signal $m_d(t)$ generated at the transmitter side plus an additional noise component $v_d(t)$. A stereo-sum signal $u_s(t)$ comprising the stereo-sum signal ms(t) plus an additional noise component $v_s(t)$ is generated by a lowpass filtering of the stereo-multiplex signal u(t) with a lowpass filter 8 that receives the output signal of the frequency demodulator 11. The left audio signal is calculated by an addition of the stereo-sum signal $u_s(t)$ and the stereo-difference signal $u_d(t)$. The right audio signal r(t) is calculated by a subtraction of the stereo-difference signal $u_d(t)$ from the stereo-sum signal $u_s(t)$. The left output channel consists of of the left audio signal l(t) and a noise component $v_d(t) + v_s(t)$ and the right audio channel consists of the right audio signal r(t) and a noise component $v_s(t) - v_d(t)$.

Therefore, without consideration of the noise $n_b(t)$ introduced in the transmission chain, the stereo-sum signal $m_s(t)$ is generated by a lowpass filtering of the stereo-multiplex signal and the stereo-difference signal is generated by a coherent amplitude demodulation of the amplitude modulated stereo-difference signal. The left and right audio signals l(t) and r(t) are calculated by addition and subtraction of the stereo-sum signal and the stereo-difference signal:

$$r(t) = m_s(t) - m_d(t) = (a_l(t) + a_r(t)) - (a_l(t) - a_r(t)) = 2a_r(t)$$

$$l(t) = m_s(t) + m_d(t) = (a_l(t) + a_r(t)) + (a_l(t) - a_r(t)) = 2a_l(t)$$

For the calculation of the noise of the frequency demodulated signal the noise at the input of the frequency demodulator is assumed to be zero mean Gaussian noise. FIG. 8 shows the assumed power spectral density of the noise $n_b(t)$ at the input of the frequency demodulator. The power spectral density $S_{n_b n_b}(j\omega)$ equals to $N_0/2$ from frequencies $-\omega_c - B_n$ to $-\omega_c + B_n$ and from frequencies $\omega_c - B_n$ to $\omega_c + B_n$. With $N_0$ being the value of the power spectral density of the noise, $\omega_c$ being the fm carrier frequency and $B_n$ being the noise bandwidth. It is shown in Kammeyer, Nachrichtenübertragung, ISBN 3-519-16142-7 that the power spectral density of the noise v(t) of the frequency demodulated signal can be calculated to:

$$S_{vv}(j\omega) \approx \left(\frac{\omega}{A_{FM}}\right)^2 N_o$$

The frequency demodulation performed by the demodulator applies quadratic shaping of the input noise spectrum. FIG. 9 depicts the power spectral density (PSD) $S_{vv}(j\omega)$ of the demodulator output at high carrier to noise ratios (CNRs). It can be seen that $S_{vv}(j\omega)$ over the frequency $\omega$ has the shape of a parabola.

Due to the quadratic shape of the power spectral density of the noise v(t) at the frequency demodulator output such a stereo-demultiplexer described above in connection with FIG. 10 is not optimal in terms of the noise behavior, since those parts of the spectrum of the modulation signal having a higher frequency are more deteriorated than those with a lower frequency.

SUMMARY OF THE INVENTION

It is the object underlying the present invention to provide an improved method and device to demultiplex a frequency modulated stereo-multiplex signal, in particular to improve the signal to noise ratio of a transmitted audio signal.

The inventive method is defined in independent claim 1 and the inventive device is defined in independent claim 8. Advantageous embodiments thereof are respectively defined in the respective dependent subclaims.

According to the present invention a filtering is performed for the weighting of the lower sideband and the upper sideband of the amplitude modulated stereo-difference signal.

For the calculation of the optimum weighting of both sidebands the amplitude modulated stereo-difference signal is split into a lower sideband signal and an upper sideband signal before the transfer function of the filtering is calculated on basis of a minimization of the variance of the noise included in the stereo-difference signal. Therefore, the transfer function calculated in this way optimizes the signal to noise ratio of the stereo-difference signal.

According to the present invention such a filter can consist of a single filter unit that is arranged in the signal path to generate the stereo-difference signal before the coherent amplitude demodulator, i.e. that receives the frequency demodulated stereo multiplex signal, filters it and outputs this filtered frequency demodulated stereo-multiplex signal to the coherent amplitude demodulator which performs a coherent amplitude demodulation, or it can comprise two filter units each of which is arranged after an output of a single sideband demodulator that outputs an upper sideband signal and a lower sideband signal of the stereo-difference signal separately.

To exclude problems with the separation of the left and right channel of the left and right audio signals caused by group delay distortions in the stereo-difference signal the filter according to the present invention is preferably realized as a linear phase filter.

BRIEF DESCRIPTION OF THE DRAWING

The present invention and its embodiments will be better understood from a detailed description of an exemplary embodiment thereof described in conjunction with the accompanying drawings, wherein

FIG. 10 shows a block diagram of a conventional stereo-demultiplexer.

DETAILED DESCRIPTION OF THE INVENTION

Figure 2:
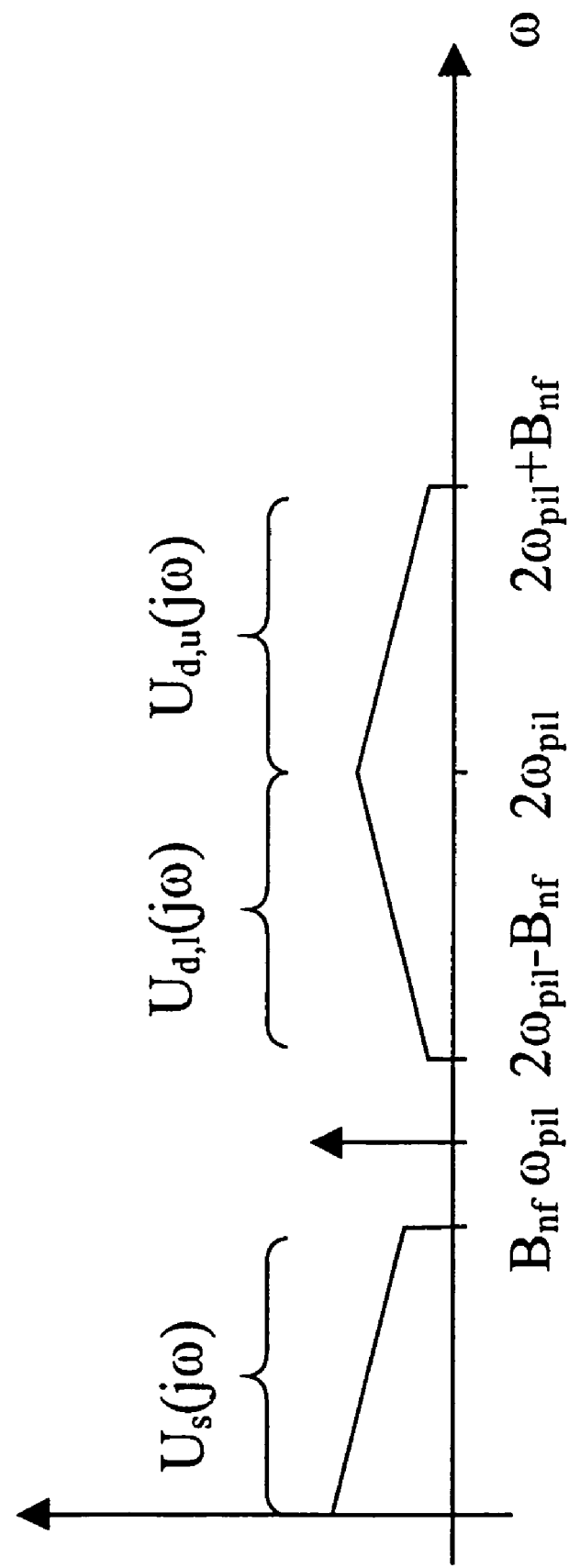
FIG. 2 shows the spectrum of a stereo-multiplexed signal.

According to the first embodiment of the present invention, for the improvement of the signal to noise ratio in the audio signal the stereo-difference signal $u_d(t)$ is split into two single sideband signals $u_{d,l}(t)$ and $u_{d,u}(t)$ and a weighting operation of each of these two single sideband signals is performed before they are added to generate the stereo-difference signal. The signal $u_{d,l}(t)$ contains the information of the lower sideband of the amplitude modulated stereo-difference signal $u_d(t)$ and the signal $u_{d,u}(t)$ contains the information of the upper sideband of the amplitude modulated stereo-difference signal $u_d(t)$. FIG. 2 shows the spectrum of the stereo-multiplex signal consisting of the spectrum $U_s(j\omega)$ of the stereo-sum signal $u_s(t)$ the pilot carrier the spectrum $U_{d,l}(j\omega)$ of the lower sideband of the amplitude modulated single sideband signal $u_{d,l}(t)$ the spectrum $U_{d,u}(j\omega)$ of the upper sideband of the amplitude modulated single sideband signal $u_{d,u}(t)$.

Figure 1:
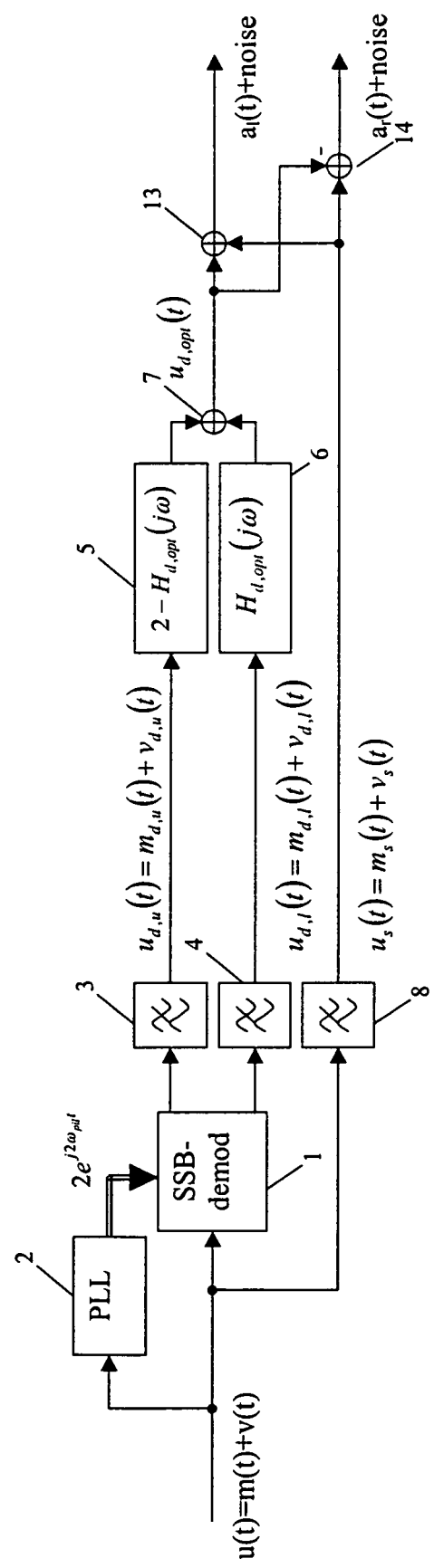
FIG. 1 shows a block diagram of a stereo-demultiplexer according to a first preferred embodiment of the present invention.

The block diagram of FIG. 1 shows a stereo-demultiplexer according to the present invention that demodulates the lower and upper sideband $u_{d,l}(t)$ and $u_{d,u}(t)$ of the stereo-difference signal $u_d(t)$ separately. In the stereo-demultiplexer according to the present invention the stereo-sum signal $u_s(t)$ is generated identical to the stereo-sum signal $u_s(t)$ shown in FIG. 10, i.e. by a lowpass filtering of the stereo-multiplex signal $u(t)$ with a lowpass filter 8. According to the present invention, the coherent amplitude demodulation of the amplitude modulated stereo-difference signal is performed with a single sideband demodulator 1 that receives the stereo-multiplex signal $u(t)$ and at a second input the complex signal $2(\cos(2\omega_{pil}t)+j\cdot\sin(2\omega_{pil}t))$ from the PLL circuit 2. The single sideband demodulator 1 comprises digital filters and generates the two single sideband signals which respectively pass lowpass filters 3 and 4 to become the lower sideband signal $u_{d,l}(t)$ and the upper sideband signal $u_{d,u}(t)$ with $u_d(t)=u_{d,l}(t)+u_{d,u}(t)$.

In case of amplitude modulation both sideband signals contain the same information $$m_{d,u}(t) = m_{d,l}(t) = \frac{m_d(t)}{2}$$

and additionally a respective noise component $v_{d,u}(t)$ and $v_{d,l}(t)$, i.e.

$u_{d,l}(t)=m_{d,l}(t)+v_{d,l}(t)$ $u_{d,u}(t)=m_{d,u}(t)+v_{d,u}(t)$.

The signal $u_{d,l}(t)$ contains all information of the lower sideband and the signal $u_{d,u}(t)$ contains all information of the upper sideband of the amplitude modulated stereo-difference signal $u_d(t)$.

The output signals of the lowpass filters 3 and 4 are respectively input to a filter unit which respectively weights the respective input signal with a factor dependent on the frequency. The output signal of the lowpass filter 3, i.e. the upper sideband signal $u_{d,u}(t)$ is input to a first filter unit 5 having a first transfer function and the output signal of the lowpass filter 4, i.e. the lower sideband signal $u_{d,l}(t)$ is input to a second filter unit 6 which has a second transfer function. Both of these transfer functions are generated according to the present invention. The output signals of both filter units 5 and 6 are input to an adder 7 which performs a summation of both signals and therewith generates a stereo-difference signal $u_{d,opt}(t)$ which is filtered according to the present invention. The further generation of the right and left audio channel is performed like with the stereo-demultiplexer according to the prior art shown in FIG. 10. Of course, due to the filtering of the stereo-difference signal and generation of the optimal filtered stereo-difference signal $u_{d,opt}(t)$ according to the present invention the noise components included in the left and right audio channel are reduced.

In the following it will be shown how the first transfer function $F-H_{d,opt}(j\omega)$ of the first filter unit 5 and the second transfer function $H_{d,opt}(j\omega)$ of the second filter unit 6 that in connection perform the optimal filtering are determined according to a preferred embodiment of the present invention.

Figure 3:
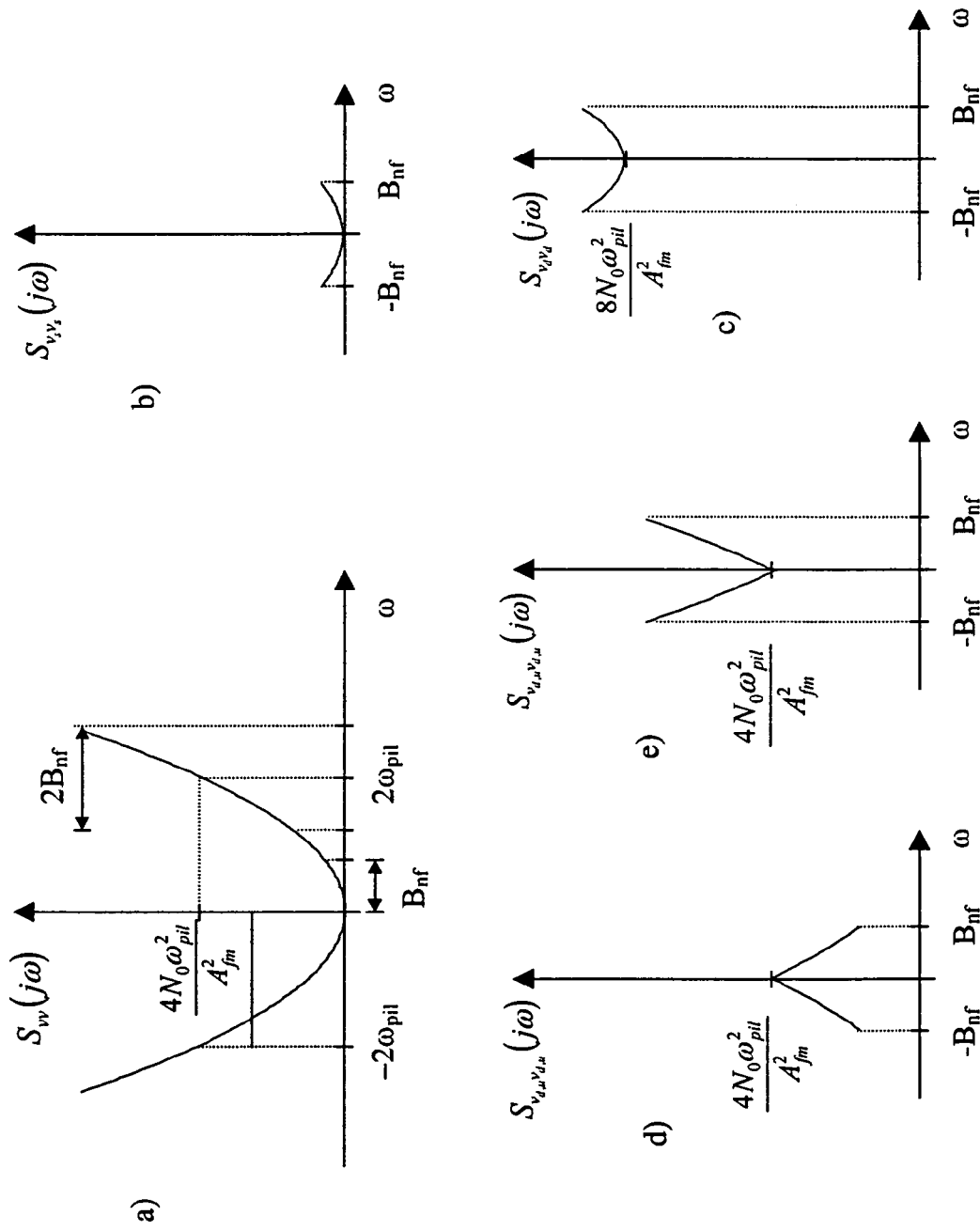
FIG. 3 shows the power spectral densities at different points of the stereo-demultiplexer shown in FIG. 1.

FIG. 3*a* shows the PSD of the frequency demodulator output noise v(t)

$$S_{vv}(j\omega) \approx \left(\frac{\omega}{A_{FM}}\right)^2 N_o$$

FIG. 3*b* shows the PSD $S_{v_s v_s}(j\omega)$ of the noise $v_s(t)$ in the band of the stereo-sum signal $$S_{v_s v_s}(j\omega) = \begin{cases} \left(\frac{\omega}{A_{FM}}\right)^2 N_0 & |\omega| \le B_{nf} \\ 0 & |\omega| > B_{nf} \end{cases} \text{ for }$$

and FIG. 3*c* shows the PDS $S_{v_d v_d}(j\omega)$ of the noise $v_d(t)$ in the band of the coherent amplitude demodulated stereo-difference signal $$S_{v_d v_d}(j\omega) = \begin{cases} N_0 \left[\left(\frac{2\omega_{pil} - |\omega|}{A_{fm}}\right)^2 + \left(\frac{2\omega_{pil} - |\omega|}{A_{fm}}\right)^2\right] & |\omega| \le B_{nf} \\ 0 & |\omega| > B_{nf} \end{cases} \text{ for }$$

FIG. 3*d* depicts the PSD $S_{v_{d,l} v_{d,l}}(j\omega)$ of the noise in the amplitude demodulated single sideband signal $u_{d,l}(t)$ $$S_{v_{d,l} v_{d,l}}(j\omega) = \begin{cases} N_0 \left(\frac{2\omega_{pil} - |\omega|}{A_{fm}}\right)^2 & |\omega| \le B_{nf} \\ 0 & |\omega| > B_{nf} \end{cases} \text{ for }$$

and FIG. 3*e* depicts the PSD $S_{v_{d,u} v_{d,u}}(j\omega)$ of the noise in the amplitude demodulated single sideband signal $u_{d,l}(t)$ $$S_{v_{d,u} v_{d,u}}(j\omega) = \begin{cases} N_0 \left(\frac{2\omega_{pil} - |\omega|}{A_{fm}}\right)^2 & |\omega| \le B_{nf} \\ 0 & |\omega| > B_{nf} \end{cases} \text{ for }$$

On basis of FIGS. 3*b* and *c* it can clearly be seen that the noise components included in the stereo-sum signal have nearly no influence on the whole noise included in the audio signal in comparison with the noise components included in the stereo-difference signal. Furtheron, it is shown that the power spectral density of the noise in the band of the coherent amplitude demodulated stereo-difference signal directly corresponds to the sum of the power spectral densities of the noise in the amplitude demodulated single sideband signals. The power spectral densities shown in FIGS. 3*d* to *e* can directly be derived when comparing FIG. 3*a* with FIG. 2. FIGS. 3*d* and *e* clearly show that the power of the noise in the upper sideband of the stereo-difference signal is stronger than the power of the noise in the lower sideband of the stereo-difference signal.

According to the present invention the demodulation of the stereo-difference signal is optimized with a weighting of each of the sideband signals of the stereo-difference signal in advance to their summation which filtering ensures that the amplitude of the information is doubled, but the amount of the noise is minimized. Therefore, preferably the weight of the upper sideband $u_{d,u}(t)$ of the amplitude modulated stereo-difference signal decreases and the weight of the lower sideband $u_{d,l}(t)$ of the amplitude modulated stereo-difference signal increases with increasing frequency. To ensure that the amplitude of the information within the stereo-difference signal which is gained with the filtering according to the present invention is equal to the amplitude of the conventionally demodulated stereo-difference signal the lower sideband is filtered by the second filter unit 6 having the transfer function $H_{d,opt}(j\omega)$ whereas the upper sideband is filtered by the fist filter unit 5 having the transfer function $F-H_{d,opt}(j\omega)$ with F being an arbitrary chosen constant factor. With such a filtering the information output corresponds to the information output achieved with a stereo-demultiplexer according to the prior art, but the amount of noise included in the stereo-difference signal is minimized.

The following calculation of the transfer function $H_{d,opt}(j\omega)$ is dependent on this constant factor F which is chosen to equal 2 in the following example. Therefore, for the optimization of the demodulation of the stereo-difference signal the stereo-difference signal $U_{d,opt}(j\omega)$ is calculated using the following equation:

$$U_{d,opt}(j\omega) = H_{d,opt}(j\omega) \cdot U_{d,l}(j\omega) + (2-H_{d,opt}(j\omega)) \cdot U_{d,u}(j\omega)$$

For the PSD $S_{v_{d,opt} v_{d,opt}}(j\omega)$ of the noise in the optimal demodulated stereo-difference signal follows:

$$S_{v_{d,opt} v_{d,opt}}(j\omega) = H^2_{d,opt}(j\omega) \cdot S_{v_{d,l} v_{d,l}}(j\omega) + (2-H_{d,opt}(j\omega)))^2 \cdot S_{v_{s,u} v_{s,u}}(j\omega)$$

For the optimization the variance $$\sigma^2_{v_{d,opt}} = \frac{1}{2\pi} \int_{-B_{nf}}^{B_{nf}} S_{v_{d,opt} v_{d,opt}}(j\omega) d\omega$$

$$= \frac{2}{2\pi} \int_0^{B_{nf}} S_{v_{d,opt} v_{d,opt}}(j\omega) d\omega$$

of the noise in the stereo-difference signal $u_{d,opt}(t)$ is minimized using the following equation:

$$\sigma^2_{v_{d,opt}} =$$

-continued $$\frac{N_0}{\pi A_{fm}^2} \int_0^{B_{nf}} H^2_{d,opt}(j\omega) \cdot (2\omega_{pil} - \omega)^2 + (2 - H_{d,opt}(j\omega))^2 (2\omega_{pil} + \omega)^2 d\omega$$

Therewith, the transfer function of the optimum filter for the filtering of the stereo-difference signal can be calculated to:

$$H_{d,opt}(j\omega) = \frac{1 + \frac{\omega}{\omega_{pil}} + \frac{1}{4}\frac{\omega^2}{\omega_{pil}^2}}{1 + \frac{1}{4}\frac{\omega^2}{\omega_{pil}^2}}$$

Figure 4:
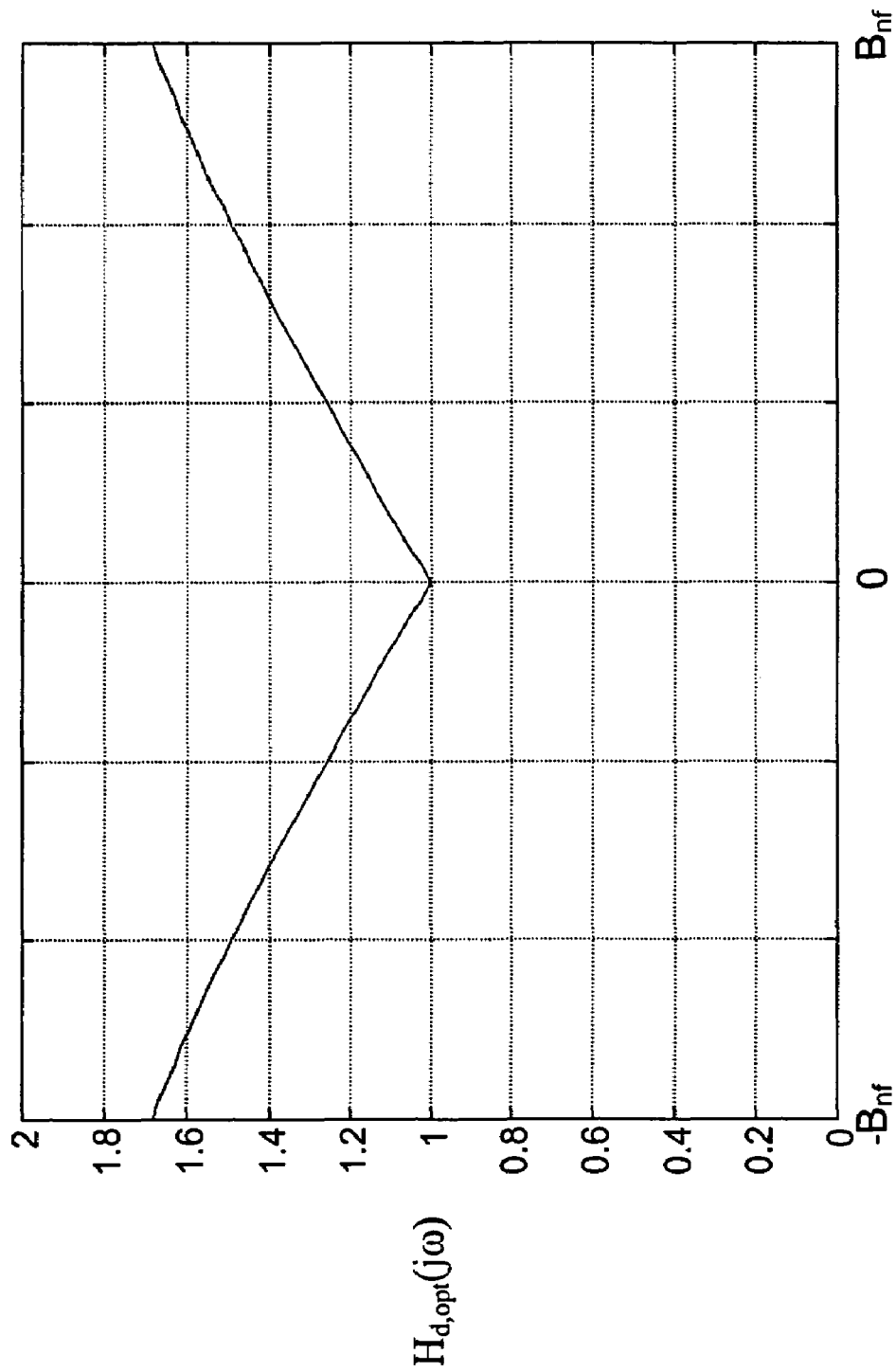
FIG. 4 shows the transfer function of the filter $H_{d,opt}(j\omega)$ for the optimal demodulation of the stereo-difference signal shown in FIG. 1.

This transfer function of the filter $H_{d,opt}(j\omega)$ which is the second transfer function for the second filter unit (6) for optimal stereo-difference signal demodulation is depicted in FIG. 4.

It can clearly be seen from FIG. 4 that the second transfer function is not constant and that with an increasing frequency the second transfer function increases as well. Therewith, the first transfer function is also not constant and the second transfer function decreases with an increasing value of the frequency.

Figure 5:
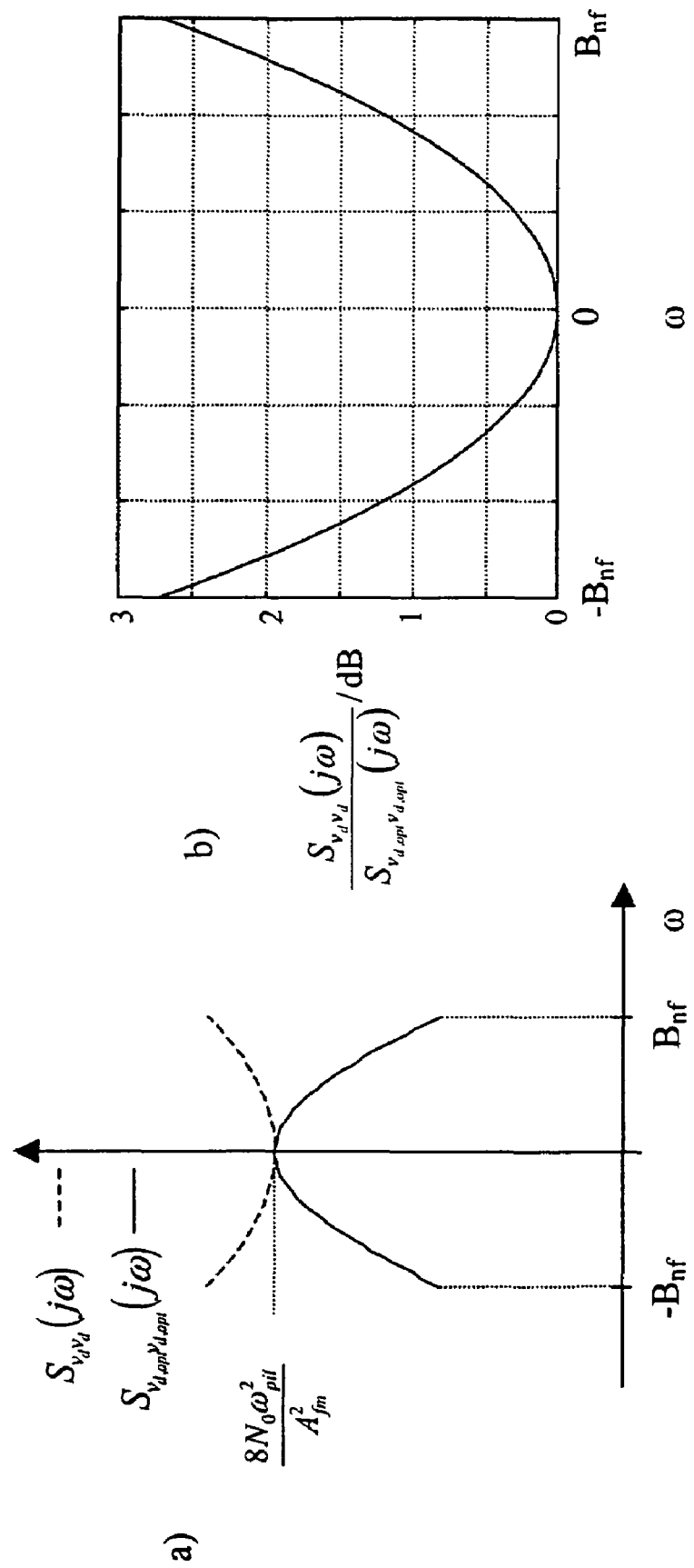
FIG. 5 shows the power spectral densities of the optimal demodulated stereo-difference signal according to the present invention and a conventional amplitude demodulated stereo-difference signal and the gain of the power spectral density of the stereo-difference signal demodulated according to the present invention against the conventional demodulated stereo-difference signal.

FIG. 5a depicts the PSD of the optimal (solid line) and conventional (dashed line) demodulated stereo-difference signal. It can clearly be seen that the PSD of the stereo-difference signal demodulated according to the present invention is decreasing with an increasing absolute value of the frequency. FIG. 5b) depicts the gain of the PSD of the optimal demodulated stereo-difference signal $S_{v_{d,opt}v_{d,opt}}(j\omega)$ against the PSD of the conventional demodulated stereo-difference signal $S_{v_d v_d}(j\omega)$ in dB over the frequency co. For low frequencies no gain can be achieved. With increasing frequency a gain up to 2.7 dB at $$\frac{B_{nf}}{2\pi} = 15 \text{ kHz}$$

can be achieved due to the high differences in the PSD of the noise in the upper sideband and the lower sideband of the amplitude modulated stereo-difference signal. The gain in SNR is 0.866 dB for an audio bandwidth of $$\frac{B_{nf}}{2\pi} = 15 \text{ kHz}.$$

Figure 6:
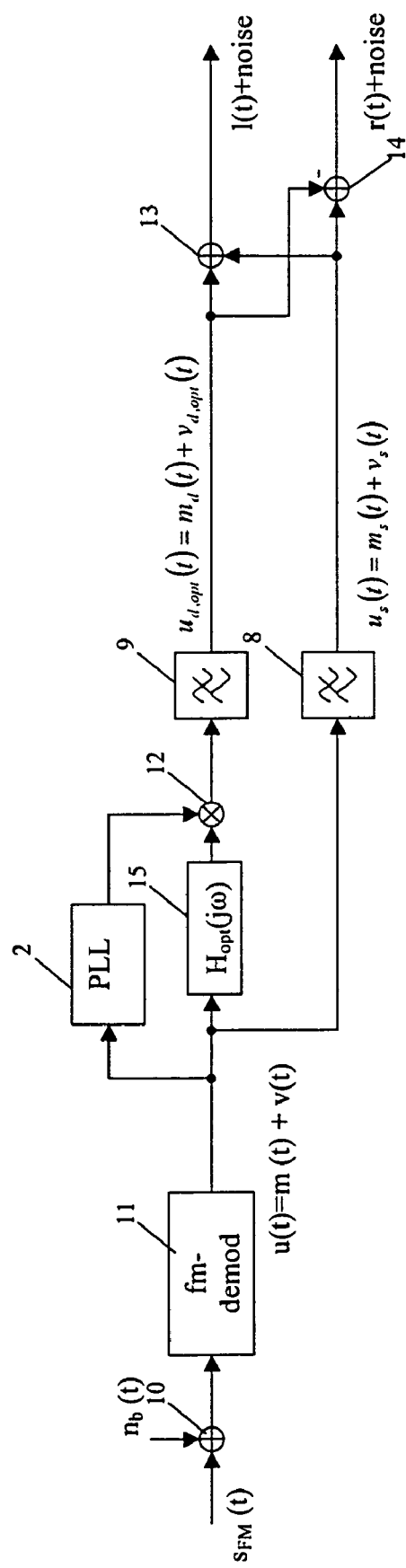
FIG. 6 shows a block diagram of a stereo-demultiplexer according to a second preferred embodiment of the present invention.

FIG. 6 shows a second preferred embodiment according to the present invention to improve the SNR of the audio signal. To realize this second embodiment, the state of the art stereo-demultiplexer is modified by inserting a filter unit having a transfer function $H_{opt}(j\omega)$ before the coherent demodulation of the stereo-difference signal. The transfer function $H_{opt}(j\omega)$ can be generated with a frequency transformation of the first transfer function of the first filter unit filtering the upper sideband $(2-H_{d,opt}(j\omega))$ in the first embodiment according to the present invention.

$$H_{opt}(j\omega) = 2 - H_{d,opt}(j(\omega) - 2\omega_{pil}))$$

$$= 2 - \frac{1 + \frac{\omega - 2\omega_{pil}}{\omega_{pil}} + \frac{1}{4}\frac{(\omega - 2\omega_{pil})^2}{\omega_{pil}^2}}{1 + \frac{1}{4}\frac{(\omega - 2\omega_{pil})^2}{\omega_{pil}^2}}$$

$$= \frac{1 - \frac{\omega - 2\omega_{pil}}{\omega_{pil}} + \frac{1}{4}\frac{(\omega - 2\omega_{pil})^2}{\omega_{pil}^2}}{1 + \frac{1}{4}\frac{(\omega - 2\omega_{pil})^2}{\omega_{pil}^2}}$$

Figure 7:
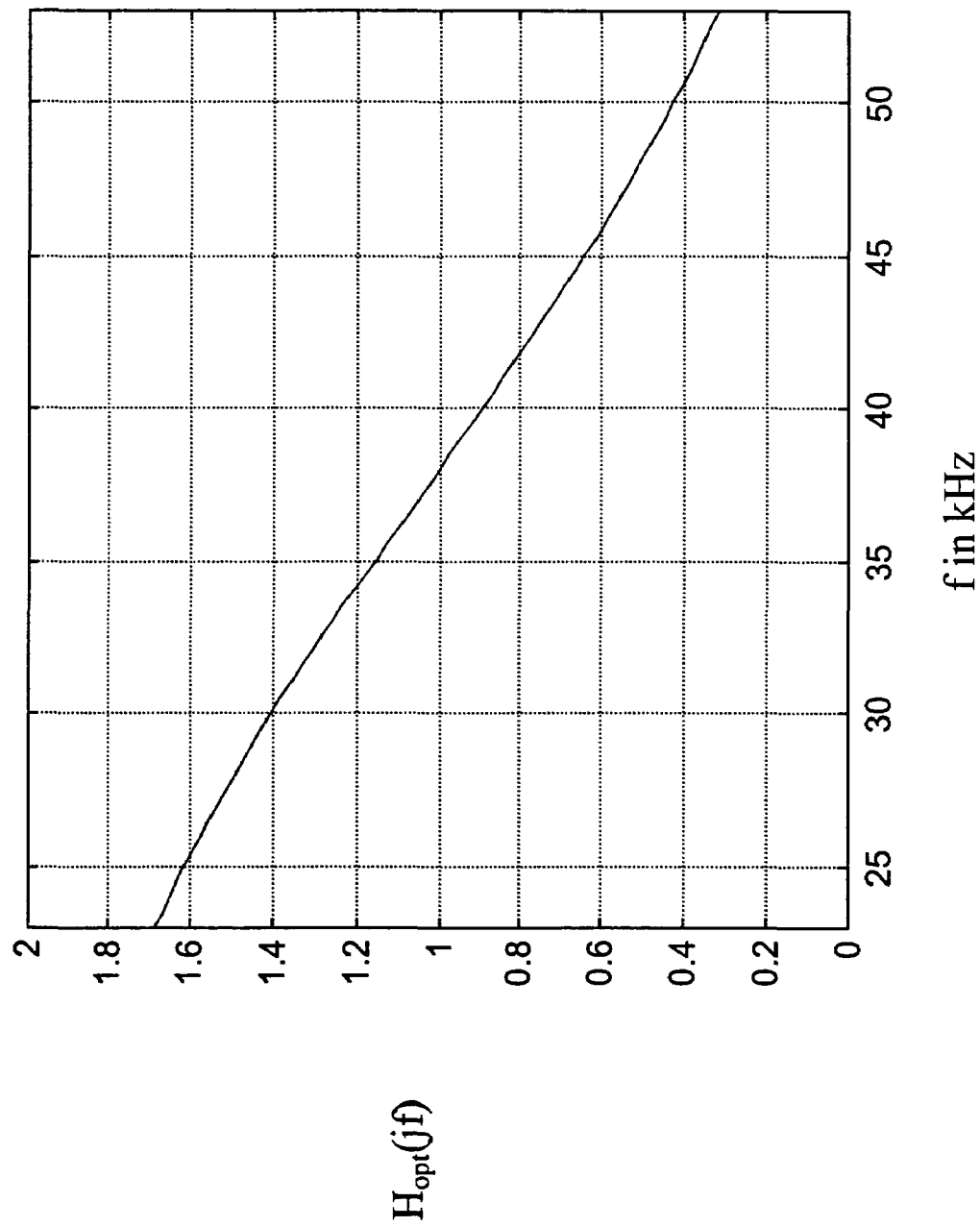
FIG. 7 shows the transfer function of the weighting filter for the optimum demodulation of the stereo-difference signal according to FIG. 6.
Figure 8:
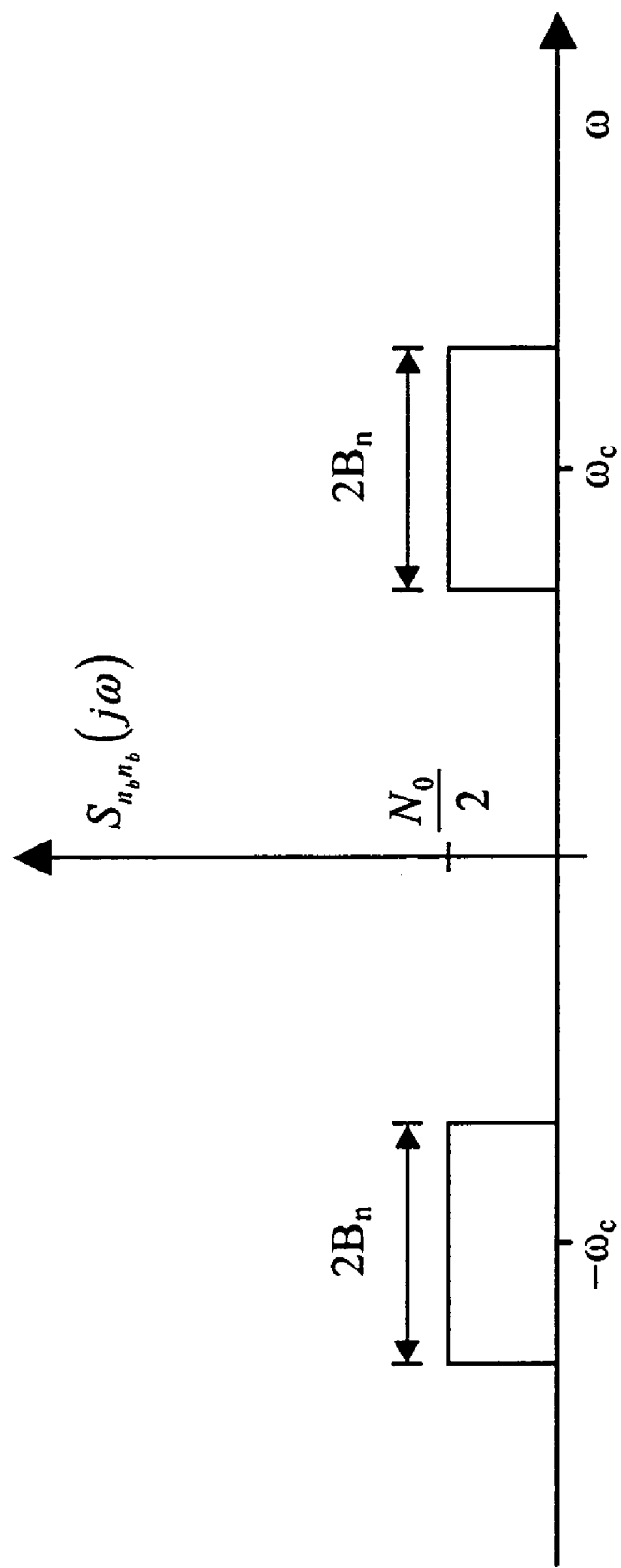
FIG. 8 shows the assumed power spectral density of the noise at the input of the frequency demodulator.
Figure 9:
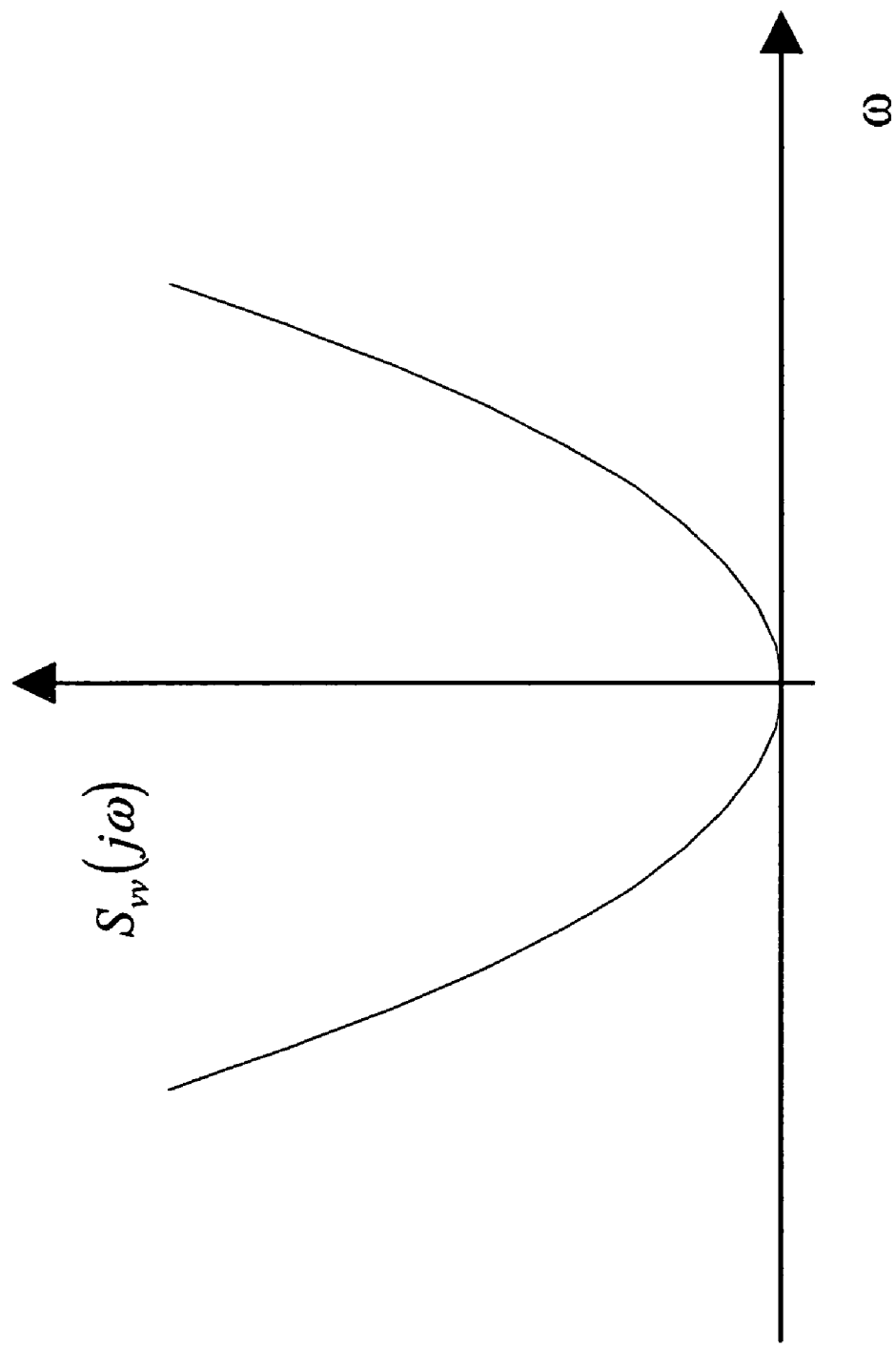
FIG. 9 shows the power spectral density of the noise at the frequency demodulator output.

FIG. 7 shows this transfer function $H_{opt}(jf)$ over the frequency f in kHz for $B_{nf}=2\pi \cdot 15$ kHz and $\omega_{pil}=2\pi \cdot 19$ kHz.

It can clearly be seen from FIGS. 4 and 7 that the weighting factors for the upper and the lower sideband are only identical at twice the frequency of the pilot carrier, i.e. in a part of the signal that carries no audio information.

The filter unit 15 having the transfer function $H_{opt}(j\omega)$ of the second embodiment according to the present invention as well as both filter units 5 and 6 according to the first embodiment of the present invention should be realized as linear phase filters to exclude problems with the L/R channel separation of the left and right audio channel caused by group delay distortions in the stereo-difference signal.

For both of the above examples the transfer functions of the filter units are calculated on the assumption of zero mean Gaussian noise at the input of the frequency demodulator. Of course, these transfer functions can also be calculated for other noise shapes.

The invention claimed is:

1. A method for demultiplexing a stereo multiplex signal, comprising the steps of:
   single sideband demodulating said stereo multiplex signal so as to obtain an upper sideband signal of an amplitude modulated stereo difference signal of said stereo multiplex signal;
   single sideband demodulating said stereo multiplex signal so as to obtain a lower sideband signal of said stereo difference signal;
   filtering said upper sideband signal in accordance with a first filter transfer function; and
   filtering said lower sideband signal in accordance with a second filter transfer function that is different from said first filter transfer function.

2. The method of claim 1, comprising the step of:
   generating, on the basis of said filtered upper sideband signal and said filtered lower sideband signal, said stereo-difference signal.

3. The method of claim 1, wherein said first and second filter transfer functions are dependent on the frequency.

4. The method of claim 3, wherein
   said first filter transfer function is chosen such that said filtering of said upper sideband signal decreases the weight of said upper sideband signal with increasing frequency, and
   said second filter transfer function is chosen such that said filtering of said lower sideband signal increases the weight of said lower sideband signal with increasing frequency.

5. The method of claim 1, wherein said first and second filter transfer functions are chosen so as to minimize the variance of noise included in said stereo-difference signal.

6. The method of claim 5, wherein said first and second transfer functions are respectively calculated prior to said demultiplexing on the basis of an assumed noise distribution at an input of a frequency demodulator that is configured and adapted to demodulate a frequency modulated stereo multiplex signal to obtain said stereo multiplex signal.

7. The method of claim 6, wherein said assumed noise distribution at said input of said frequency demodulator is assumed to be a zero mean Gaussian noise distribution.

8. A method for demultiplexing a stereo multiplex signal, comprising the steps of:
filtering said stereo multiplex signal in accordance with a filter transfer function that applies a first weighting factor to an upper sideband signal of an amplitude modulated stereo difference signal of said stereo multiplex signal and a second weighting factor that is different from said first weighting factor to a lower sideband signal of said stereo difference signal; and
coherently demodulating said filtered stereo multiplex signal so as to obtain said stereo difference signal.

9. The method of claim 8, comprising the step of:
filtering said stereo difference signal obtained by coherently demodulation.

10. The method of claim 8, wherein said filter transfer function is dependent on the frequency.

11. The method of claim 8, wherein
said filter transfer function is chosen such that said filtering of said stereo multiplex signal decreases the weight of said upper sideband signal and said lower sideband signal with increasing frequency of said stereo multiplex signal.

12. The method of claim 8, wherein said transfer function is chosen so as to minimize the variance of noise included in said stereo-difference signal.

13. The method of claim 12, wherein said noise is calculated on the basis of a weighted summation of the power spectral densities of said upper and lower sideband.

14. The method of claim 12, wherein said transfer functions are respectively calculated prior to said demultiplexing on the basis of an assumed noise distribution at an input of a frequency demodulator that is configured and adapted to demodulate a frequency modulated stereo multiplex signal to obtain said stereo multiplex signal.

15. The method of claim 14, wherein said assumed noise distribution at said input of said frequency demodulator is assumed to be zero mean Gaussian noise distribution.

16. A stereo demultiplexer for demultiplexing a stereo multiplex signal, comprising:
single sideband demodulating means configured and adapted for single sideband demodulating said stereo multiplex signal so as to obtain an upper sideband signal of an amplitude modulated stereo difference signal of said stereo multiplex signal;
single sideband demodulating means configured and adapted for single sideband demodulating said stereo multiplex signal so as to obtain a lower sideband signal of said stereo difference signal;
filtering means configured and adapted for filtering said upper sideband signal in accordance with a first filter transfer function; and
filtering means configured and adapted for filtering said lower sideband signal in accordance with a second filter transfer function that is different from said first filter transfer function.

17. The stereo demultiplexer of claim 16, comprising:
adding means configured and adapted for generating, on the basis of said filtered upper sideband signal and said filtered lower sideband signal, said stereo-difference signal.

18. The stereo demultiplexer of claim 16, wherein said first and second filter transfer functions are dependent on the frequency.

19. The stereo demultiplexer of claim 18, wherein
said first filter transfer function is chosen so as to decrease the weight of said upper sideband signal with increasing frequency, and
said second filter transfer function is chosen so as to increase the weight of said lower sideband signal with increasing frequency.

20. The stereo demultiplexer of claim 16, wherein said first and second filter transfer functions are chosen so as to minimize the variance of noise included in said stereo-difference signal.

21. A stereo demultiplexer for demultiplexing a stereo multiplex signal, comprising:
filtering means configured and adapted for filtering said stereo multiplex signal in accordance with a filter transfer function that applies a first weighting factor to an upper sideband signal of an amplitude modulated stereo difference signal of said stereo multiplex signal and a second weighting factor that is different from said first weighting factor to a lower sideband signal of said stereo difference signal; and
coherent demodulating means configured and adapted for coherently demodulating said filtered stereo multiplex signal so as to output said stereo difference signal.

22. The stereo demultiplexer of claim 21, comprising:
filtering means configured and adapted for filtering said stereo difference signal output by said coherent demodulating means.

23. The stereo demultiplexer of claim 21, wherein said filter transfer function is dependent on the frequency.

24. The stereo demultiplexer of claim 23, wherein
said filter transfer function is chosen such that said filtering of said stereo multiplex signal decreases the weight of said upper sideband signal and said lower sideband signal with increasing frequency of said stereo multiplex signal.

25. The stereo demultiplexer of claim 21, wherein said transfer function is chosen so as to minimize the variance of noise included in said stereo-difference signal.

* * * * *